United States Patent [19]
Chang

[11] Patent Number: 4,992,390
[45] Date of Patent: Feb. 12, 1991

[54] TRENCH GATE STRUCTURE WITH THICK BOTTOM OXIDE

[75] Inventor: Hsueh-Rong Chang, Scotia, N.Y.

[73] Assignee: General Electric Company, Schenectady, N.Y.

[21] Appl. No.: 376,072

[22] Filed: Jul. 6, 1989

[51] Int. Cl.⁵ .................. H01L 21/26; H01L 21/283; H01L 29/784
[52] U.S. Cl. ...................................... 437/42; 437/67
[58] Field of Search .............. 437/41, 42, 38, 67; 357/23.4

[56] References Cited

U.S. PATENT DOCUMENTS

| | | | |
|---|---|---|---|
| 4,430,792 | 2/1984 | Temple | 437/29 |
| 4,645,564 | 2/1987 | Morie et al. | 156/643 |
| 4,845,048 | 7/1989 | Tamaki et al. | 437/62 |

FOREIGN PATENT DOCUMENTS

| | | | |
|---|---|---|---|
| 55-65463 | 5/1980 | Japan | 357/23.4 |
| 59-188938 | 10/1984 | Japan | 437/67 |
| 60-38832 | 2/1985 | Japan | 437/67 |
| 60-226185 | 11/1985 | Japan | 357/23.4 |
| 63-43356 | 2/1988 | Japan | 437/67 |
| 63-207170 | 8/1988 | Japan | 437/67 |

*Primary Examiner*—Olik Chaudhuri
*Assistant Examiner*—D. Graybill
*Attorney, Agent, or Firm*—Robert Ochis; James C. Davis, Jr.; Marvin Snyder

[57] ABSTRACT

Improved trench gate field effect devices are provided by forming a thick oxide at the bottom of the trench. This thick oxide may be preferably formed by ion implantation into the bottom of the trench.

5 Claims, 20 Drawing Sheets

TRENCH GATE STRUCTURE WITH THICK BOTTOM OXIDE

BACKGROUND OF THE INVENTION

1. Field of the Invention

The present invention relates to field effect semiconductor devices, and more particularly, to field effect semiconductor devices having trench gates.

2. Background Information

Field effect semiconductor devices having their gate electrodes disposed on the major surface of the semiconductor body have been known for many years. More recently, with the advent of reactive ion etching (RIE), the fabrication of trench gate devices has become feasible because of the ability to etch trenches having substantially vertical walls. Trench gate devices are fabricated by etching a trench in the semiconductor body through the body region of the field effect semiconductor device, growing a gate oxide on the walls of the trench and refilling the trench with polycrystalline silicon as the conductive portion of the gate electrode. Such structures can suffer from several problems. First, if the gate oxide is grown directly on the as etched trench structure, the damage to the surface silicon material resulting from the RIE etching results in many surface states at the gate oxide/silicon interface with the result that a poor field effect device results. Further, for high voltage devices (greater than about 10 volts), the sharp corner of the bottom of the trench combined with the thin gate oxide can lead to device breakdown at the corner of the trench.

Consequently, an improved technique for fabricating such devices is desirable.

OBJECTS OF THE INVENTION

A primary object of the present invention is to provide a method of fabricating a trench gate structure which has a high breakdown voltage.

Another object of the present invention is to provide a method of fabricating a trench gate structure with a minimum number of processing steps.

Still another object of the present invention is to provide a method of fabricating a trench gate structure which contains a minimum of additional steps over those required to fabricate a surface gate structure.

A still further object of the present invention is to make use of ion implantation techniques to simplify the fabrication of a trench gate structure.

SUMMARY OF THE INVENTION

The above and other objects which will become apparent from the specification as a whole, including the drawings, are accomplished in accordance with the present invention by providing a thick oxide at the bottom of the gate trench in a trench gate field effect structure in order to avoid voltage breakdown at the lower trench corners Such a thick gate oxide may be provided by either of two alternative processes.

In the first process, a wafer containing appropriate regions and doping concentrations has a reactive ion etching masking layer formed on its upper surface. If appropriate, dopant may be introduced into the semiconductor body by implantation through an initial portion of that mask. Following patterning of the RIE mask, the desired trench structure is etched in the silicon body to the desired depth. Thereafter, oxygen is implanted in the bottom of the trenches and the structure is annealed to convert the implanted oxygen to silicon dioxide, while at the same time, annealing any dopant implant which was performed through the partially formed RIE mask. Thereafter, a damage removal process is performed on the trench walls which removes the damaged surface portion of the silicon material and exposes the silicon dioxide formed at the bottom of the trenches. Thereafter, a thin gate oxide is grown on the trench walls, the trenches are refilled with conductive material, the wafer is planarized, the remaining portions of the RIE mask are removed, a source region is formed at the top of the pedestals between the trenches and metallization is deposited.

In an alternative process, the conductive region implanted through the partially completed RIE mask is annealed prior to patterning the RIE mask. Thereafter, the mask is patterned and the trenches are etched, a damage removal process is performed, a thin gate oxide is grown on the trench walls, a silicon nitride or other protective layer is deposited over the wafer and RIE etched off the tops of the RIE mask and off the bottom of the trenches to leave a thin silicon nitride layer on the trench walls. Thereafter, a thick silicon dioxide layer is grown at the bottom of the trench, the silicon nitride layer is removed, the trench is refilled with conductive material, the wafer is planarized, the RIE mask is removed, source regions are formed and metallization is deposited.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

DETAILED DESCRIPTION

Figure 1:
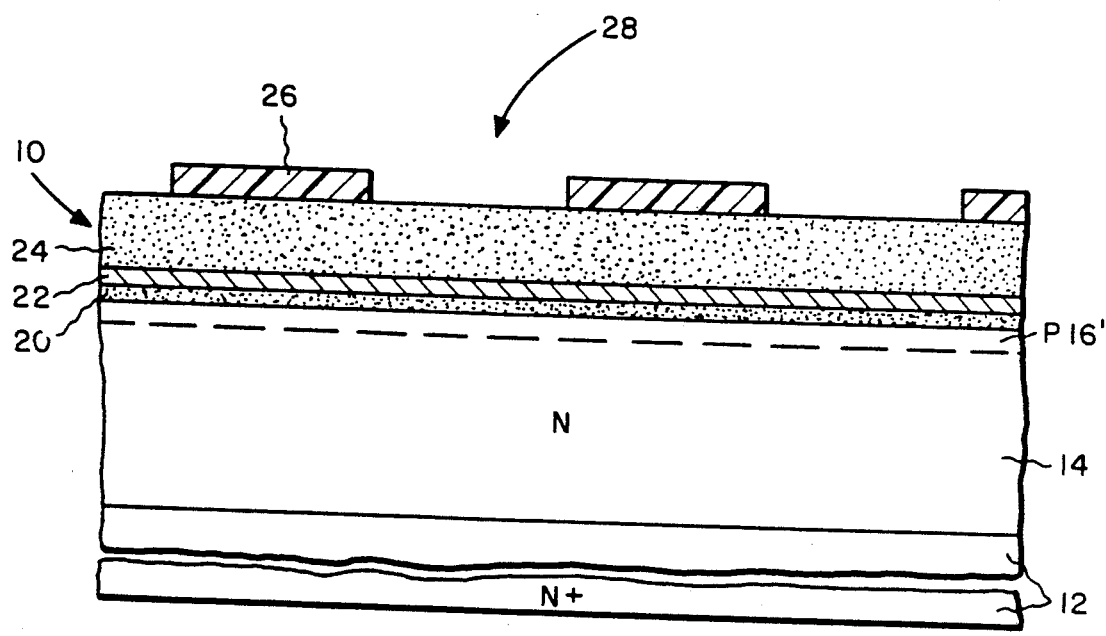
FIGS. 1-11 illustrate successive stages in the fabrication of a trench gate structure in accordance with one embodiment of the invention.
Figure 2:
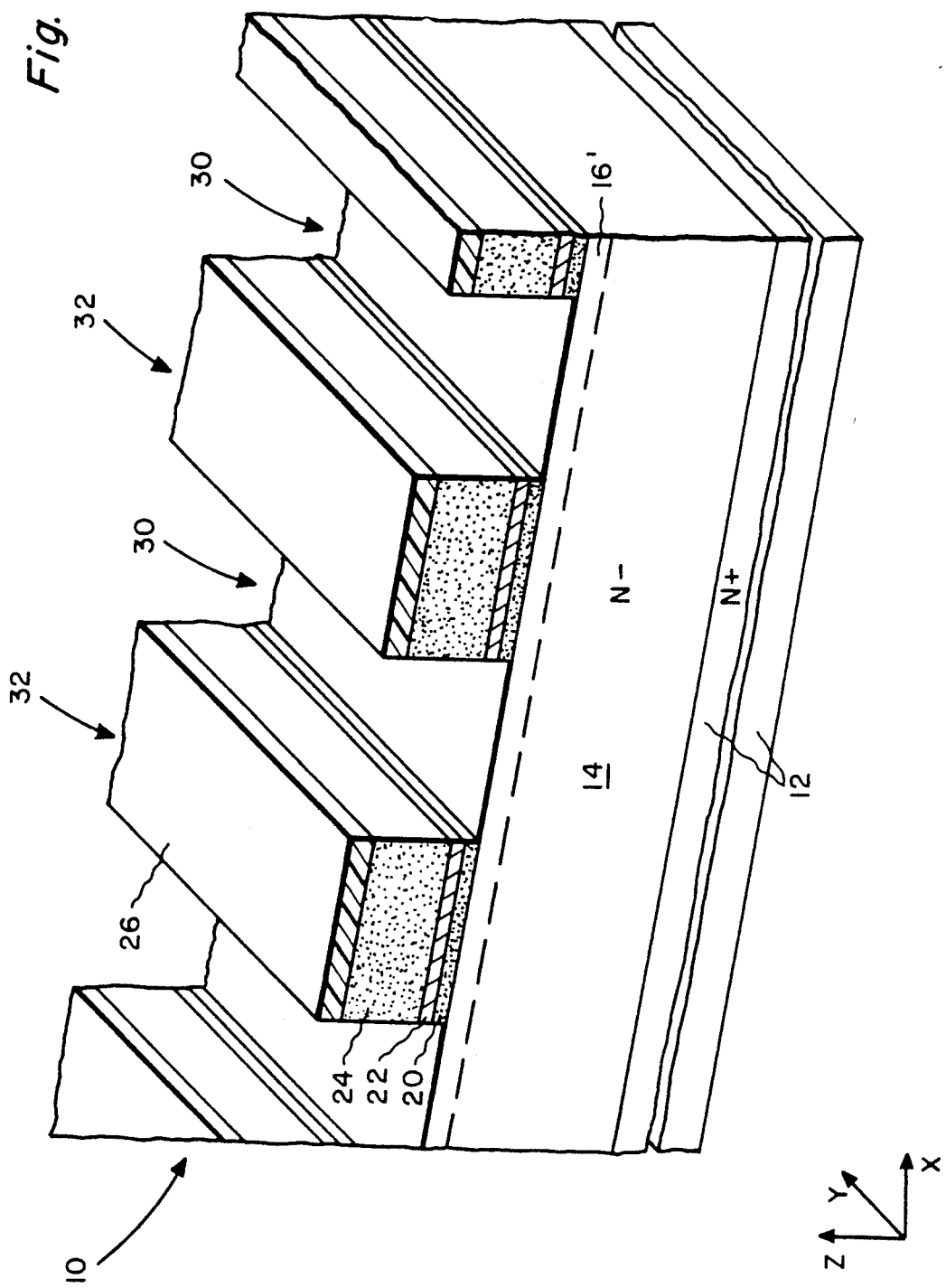

The method of the present invention may be employed to fabricate a variety of trench gate field effect structures. These structures include field effect transistors (FETs), insulated gate bipolar transistors (IGBTs), MOS controlled thyristors (MCTs) and other devices. Consequently, the regions present in the wafer at the beginning of the process depend on the device to be fabricated, and to some extent, on the voltage range over which the device is to be operated. Since he wafer structure appropriate for the fabrication of other devices will be apparent to those of ordinary skill in the art from a description of the fabrication of an FET, the following discussion of preferred embodiments of the invention is presented in terms of the fabrication of an FET. In FIG. 1, a wafer 10 is illustrated in cross-section. The wafer 10 comprises a thick substrate 12 which is heavily doped N type (N+) having an epitaxial layer 14 of lightly doped N type material (N−) disposed on the upper surface of the substrate 12. The N− layer may be omitted for low voltage (less than about 10 volt) devices. A first layer of a reactive ion etching (RIE)

masking layer 20 comprises a thin silicon dioxide layer which may be from 150 to 500 angstroms thick. The layer 20 is disposed on the N− epitaxial layer 14. A second layer of the RIE mask 22 comprises a silicon nitride layer deposited over the silicon dioxide layer 20 and preferably 500 to 2,000 angstroms thick. If desired, a P type dopant may be implanted into the N− layer 14 through the thin oxide and nitride layers as indicated by reference numeral 16'. Alternatively, the resulting P type region could be formed prior to growing the thin oxide layer 20. The implanted dopant 16' is not annealed at this time. A thick silicon dioxide layer 24 (0.5 to 2.0 microns) is then deposited over the silicon nitride layer. Thereafter, a photoresist material is disposed on the wafer and exposed to leave a pattern of photoresist material 26 with openings therein comprising a window 28 defining the desired location of the trench of the structure. After exposure and development of a photoresist mask pattern 26, the wafer is exposed to an oxide and nitride RIE etching process in which the gas mixture used to perform the etching is a mixture of $CHF_3$, $C_2F_6$ and He. This etchant etches through the thick oxide 24, the thin nitride 22 and the thin oxide 20. Once the silicon surface is reached, this RIE etching process is terminated. At the end of this step, the wafer appears in perspective view as illustrated in FIG. 2. It will be observed that the trench structure comprises a plurality of parallel Y-direction extending trenches 30 in the RIE masking layer with pedestals 32 spacing these trench portions apart in the X-direction. I prefer to remove the remaining portions 26 of the photoresist layer at this point in the process. These photoresist layers will have been somewhat thinned by the reactive ion etching process of forming the trenches in the RIE masking material and would be completely removed during the process of etching the trenches in the silicon. However, I have found that removing the photoresist prior to beginning the silicon etch results in trenches in the silicon having more nearly vertical walls.

Figure 3:
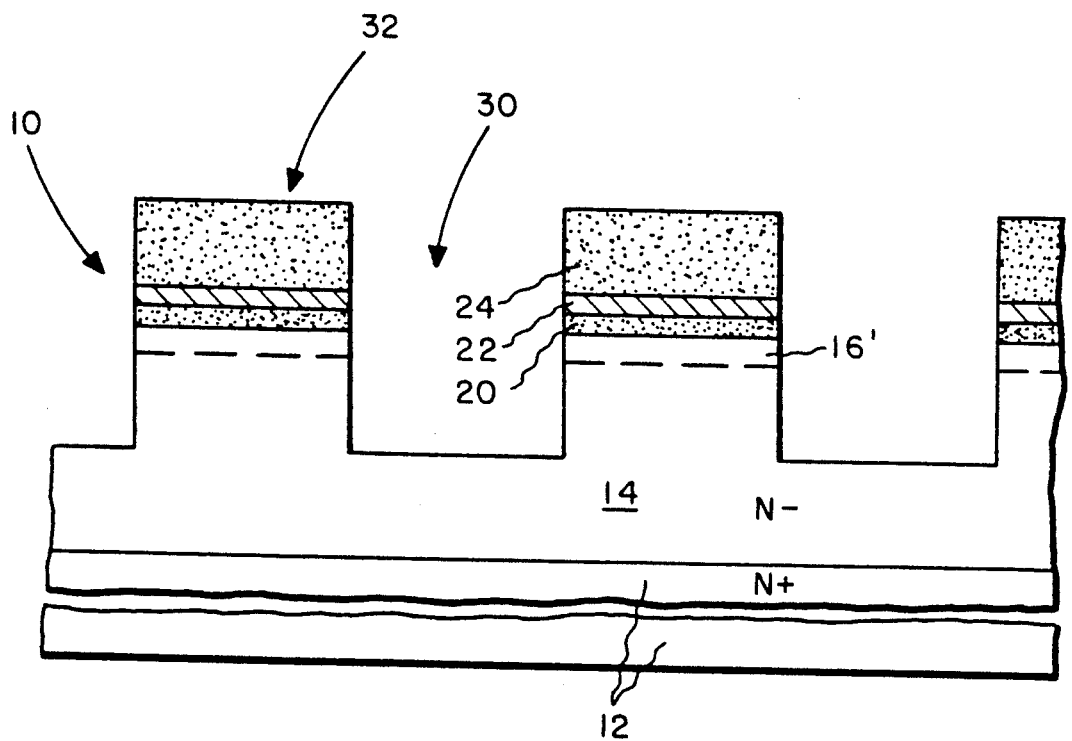
Figure 4:
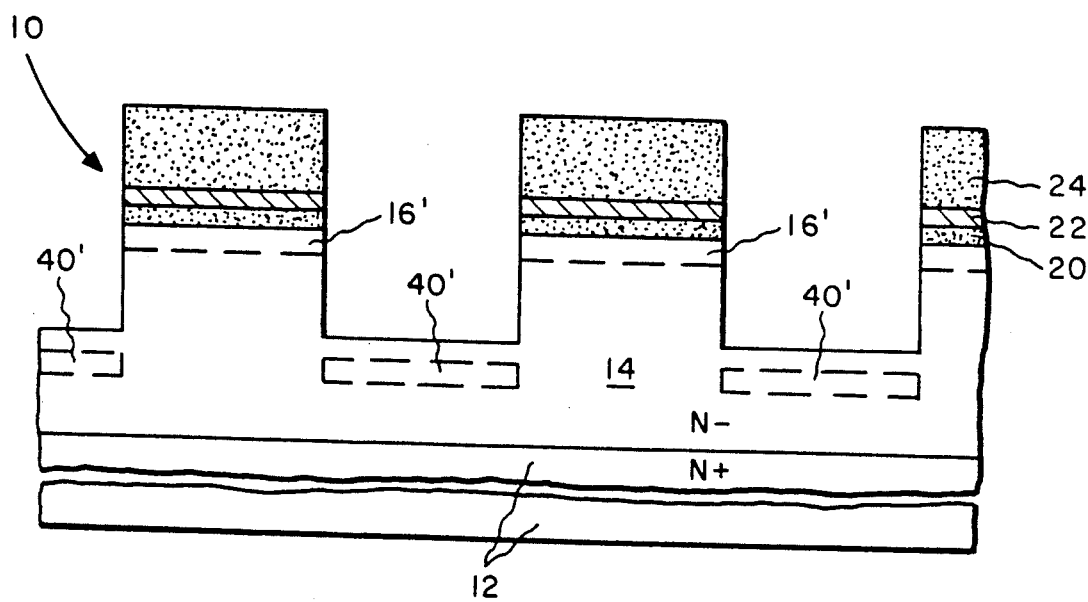

The wafer is once again exposed to an RIE etching process, with the gas in this etching process being $SiCl_4$ mixed with $N_2$. With this active agent, elemental silicon is etched rapidly, while silicon dioxide is etched very slowly. At the completion of the silicon etching step, the wafer appears in ross-section as illustrated in FIG. 3 with trenches 30 alternating with pedestals or mesas 32. Thereafter, oxygen ions are implanted into the bottom of the trenches at 150 Kev to a dosage of from 1 to $2 \times 10^{18}/cm^2$. With this implantation energy and dosage, a bottom of the trench oxide layer in the range from 0.1–0.5 microns will result. It is considered desirable to avoid any oxygen implantation into the vertical sidewalls of the trench. At the end of this step, the wafer appears in cross-section in FIG. 4 where the implanted oxygen is designated by the reference numeral 40'.

Figure 5:
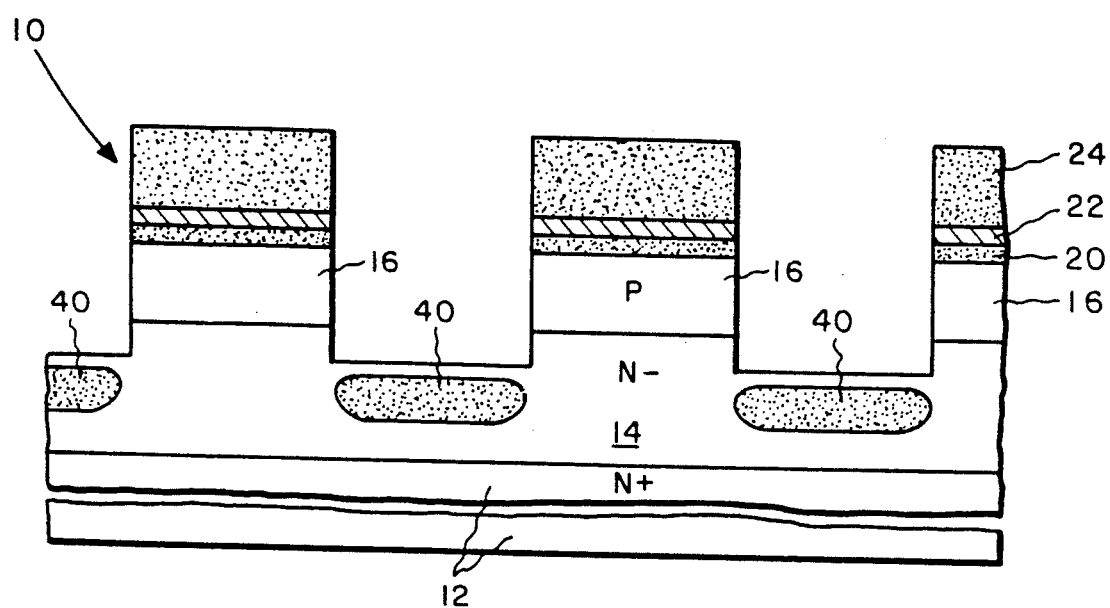

Next, the wafer 10 is annealed at a temperature in the range from 1,150° C. to 1,300° C. in a nitrogen atmosphere. This anneal preferably takes about two hours or longer at 1,150° C., depending on the desired depth of the P type region 16 whose dopant 16' was implanted through the combined thin oxide layer 20 and thin nitride layer 22 prior to formation of the thick oxide portion 24 of the RIE mask At 1,300° C., much shorter annealing time would be needed for a given P type region depth. As a further alternative, rapid thermal anneal (RTA) could be used, thereby significantly shortening the annealing. At the end of this step, the wafer appears as illustrated in FIG. 5.

Figure 6:
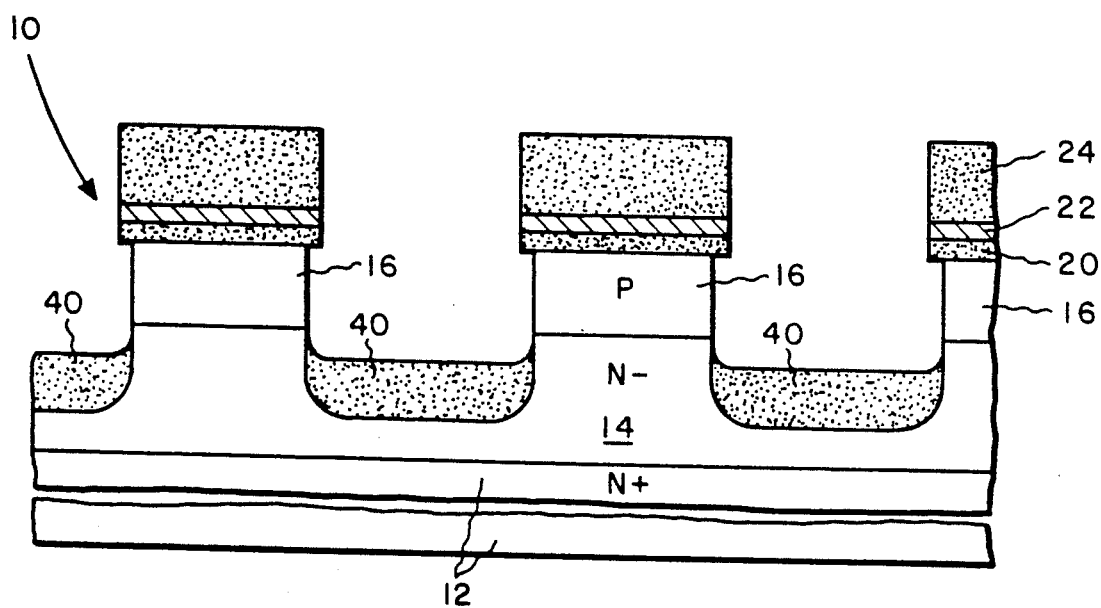

Next, the wafer is exposed to a damage removal process to remove damaged silicon from the walls of the trenches 30. One means of performing this damage removal is to thermally grow a sacrificial oxide layer on the trench walls to a desired depth in the silicon Then, that silicon dioxide layer is removed by a wet etching process. In removing that sacrificial oxide, the etching period must be carefully controlled to prevent removal of a significant portion of the thick oxide layer 40 which was formed at the bottom of the trenches by the oxygen implant and anneal. Alternatively, the damage may be removed from the walls of the trenches by exposing the wafer to a wet silicon etching process which removes the damaged silicon from the walls and any silicon which may remain on the trench bottom over the thick oxide 40. At the end of this step, the wafer appears as shown in FIG. 6.

Figure 7:
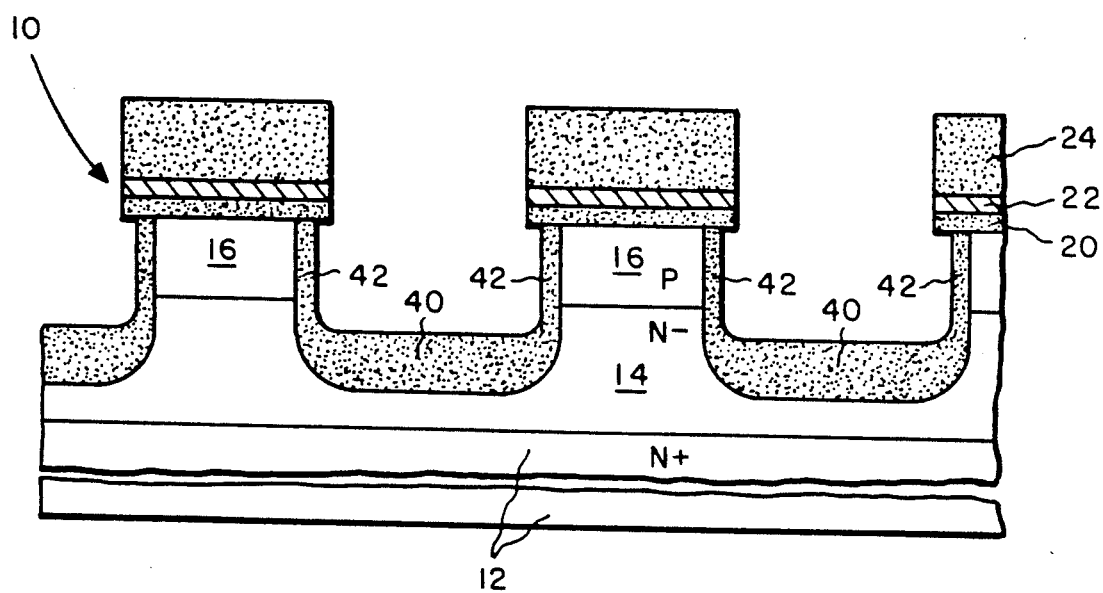

Next, a thin gate oxide 42 is grown on the trench walls. The thin gate oxide 42 is continuous with the thick oxide 40 at the bottom of the trenches. At the end of this step, the wafer appears as illustrated in FIG. 7.

Figure 8:
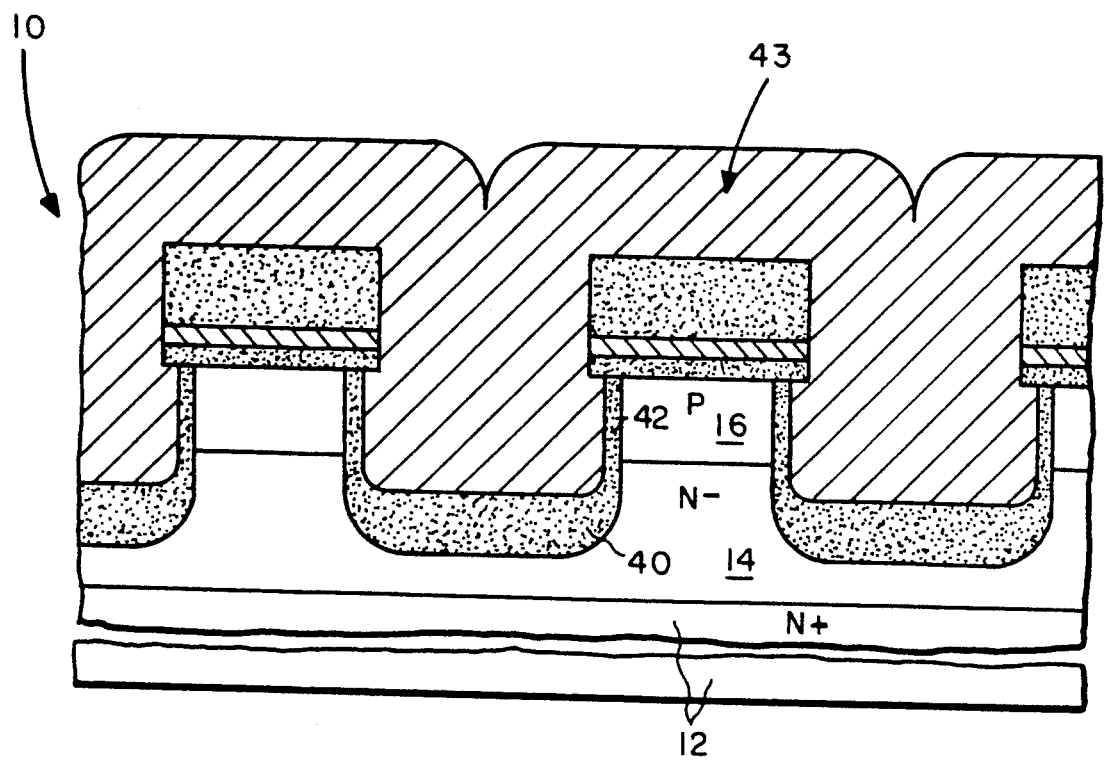

Next, the trenches are refilled by chemical vapor deposition of polycrystalline silicon 43 (FIG. 8) which is heavily doped N type (N+) material which is preferably doped with phosphorous. At the end of this step, the wafer appears as shown in FIG. 8.

Figure 9:
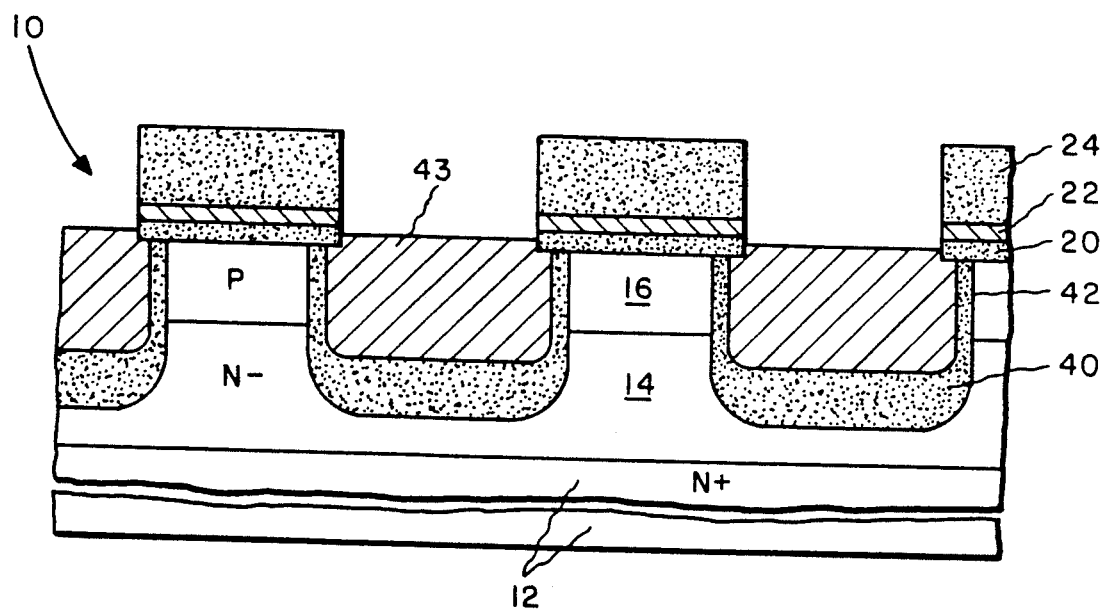

Next, the wafer is subject to a planarization etch which is selective for silicon and is etched until the deposited polycrystalline silicon is removed from the top of the thick oxide layer 24 of the RIE mask. At the end of this step, the wafer appears as shown in FIG. 9 with the exact location of the upper surface of the polycrystalline silicon relative to the upper surface of the monocrystalline silicon body, depending on the exact point in the polycrystalline silicon etching process, at which that process was terminated.

Figure 10:
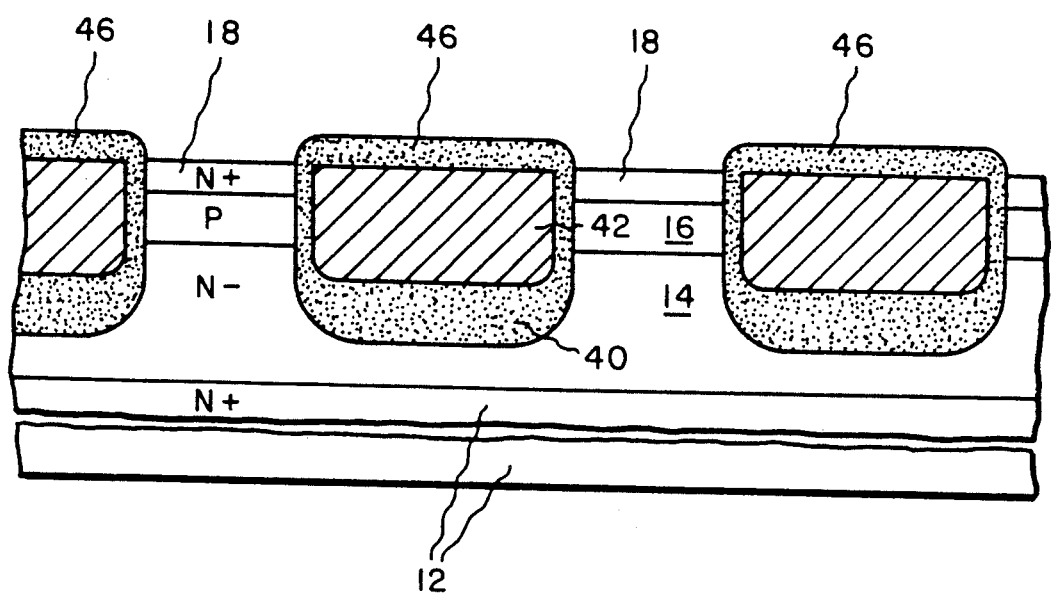

Next, the thick oxide layer 24 is removed from the surface of the wafer by a wet or dry silicon dioxide etch. This exposes the silicon nitride layer 22. Once all of the thick oxide layer 24 has been removed, an oxide layer 46 (FIG. 10) is grown on the surface of the polycrystalline silicon by thermal oxidation. This layer should be grown thick enough that a desired thickness remains after the removal of the thin oxide 20 which covers the top of the pedestals 32. The silicon nitride layer is then removed in a wet or dry silicon nitride etch and the thin silicon dioxide layer 20 on the top of the wafer is removed by a brief exposure to a silicon dioxide etchant. The etching process for the thin oxide layer 20 should be terminated in time to ensure that the desired thickness of oxide 46 on the top of polycrystalline 43 remains in place. Thereafter, source regions 18 are implanted into the upper surface of the P type region 16 and annealed. At the end of this step, the wafer appears as illustrated in FIG. 10.

Figure 11:
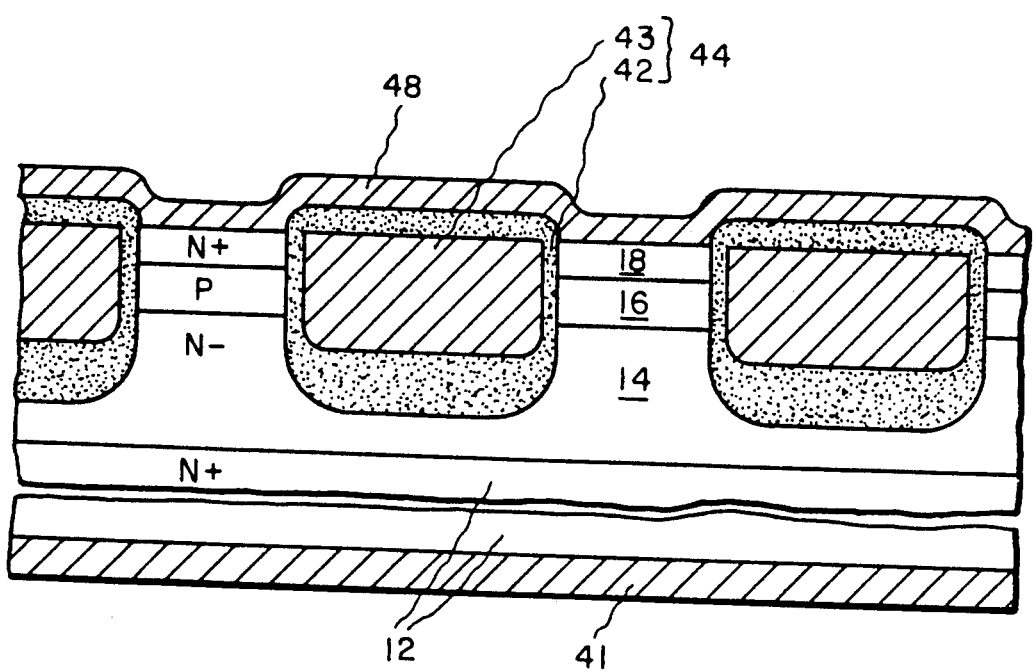
Figure 12:
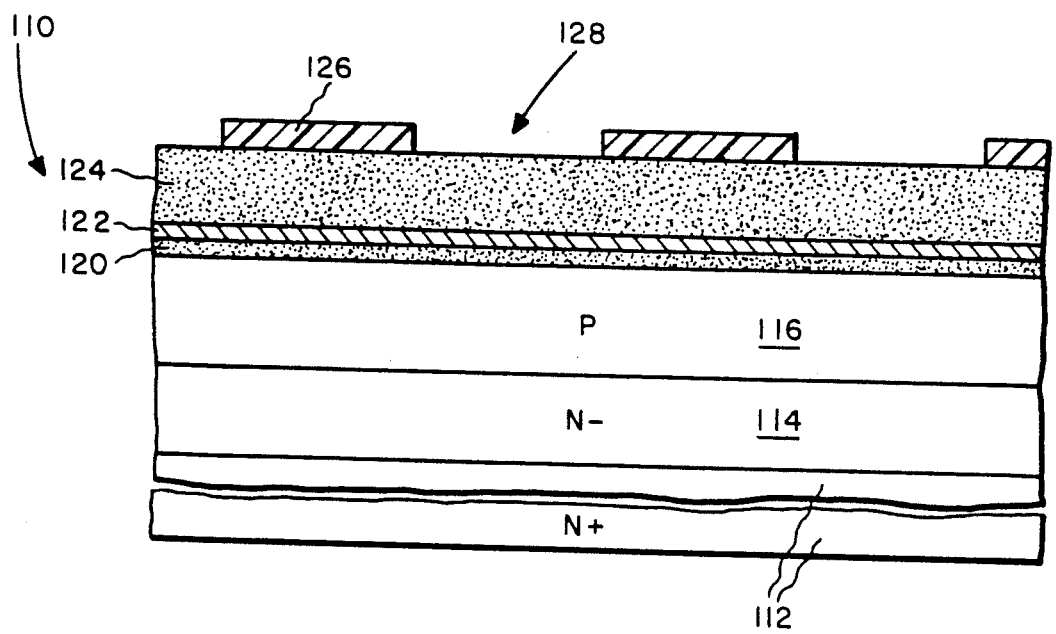
FIGS. 12-20 illustrate successive stages in the fabrication of a trench gate structure in accordance with an alternative embodiment of the invention.

Thereafter, metallization 41 on the lower surface of the wafer in ohmic contact with the N+ substrate 12 and metallization 48 on the upper surface of the wafer in ohmic contact with the source regions 18 are formed (FIG. 11). The gate electrode 44 is provided with an external connection near a peripheral portion of the wafer in a manner which is well known in the art. The pedestals or mesas 32 may preferably be 2-3 microns wide, but may be wider or narrower in accordance with the particular device design.

This process is considered a desirable process for fabricating a trench gate FET for a number of reasons. First, no additional photolithographic masking steps are required over those necessary for the formation of a surface gate (DMOSFET). Further, no additional steps other than the oxygen implantation are required over those required for the fabrication of the MOSFETs. It is noted that the annealing step for the P type body region occurs at a different point in the process since it is combined with the annealing of the oxygen implant. However, this avoids any need for an additional annealing step because of the oxygen implantation. Finally, a very desirable silicon dioxide configuration is present at the bottom of the trench in that the oxide/silicon boundary has a smooth contour which avoids abrupt changes in the oxide thickness which can lead to breakdown of the device. The thick oxide at the bottom of the trench minimizes gate capacitance as well as improving breakdown voltage.

Figure 13:
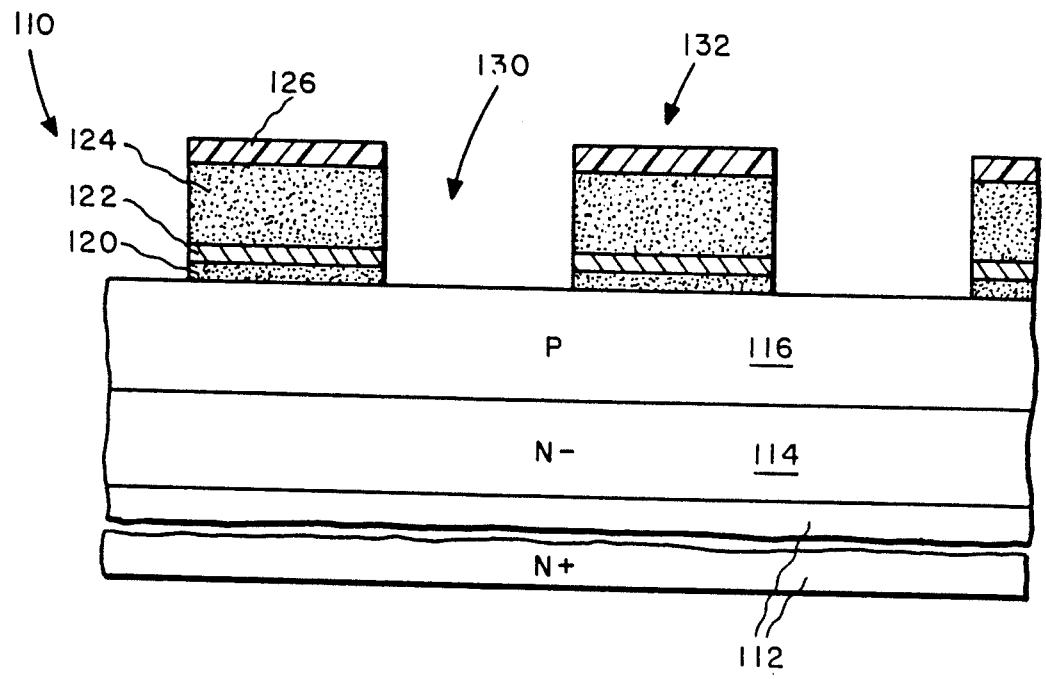

While the above described process is preferred, an alternative process is also feasible. Successive stages in that alternative process are illustrated in FIGS. 12–20 where reference numerals in the 100's are employed Reference numerals in FIGS. 12–20 which end in the same two digits as reference numerals in FIGS. 1–11 refer to similar structures and may not be discussed in detail in the present discussion. For an explanation of a element not discussed here, the reader is referred to the discussion of FIGS. 1–11. This process begins in a manner similar to that of the preferred process through the formation of the nitride layer 122 and the implantation of the dopant to form the P type body region 116 of the field effect device. At that point, the wafer 110 is annealed to drive the P type region to the desired depth. Thereafter, the thick oxide layer 124 of the RIE mask is formed by low temperature oxide deposition. The RIE masking layer is then patterned and the trenches 130 are etched to the surface of the silicon. At the end of that step, the wafer appears as illustrated in FIG. 13.

Figure 14:
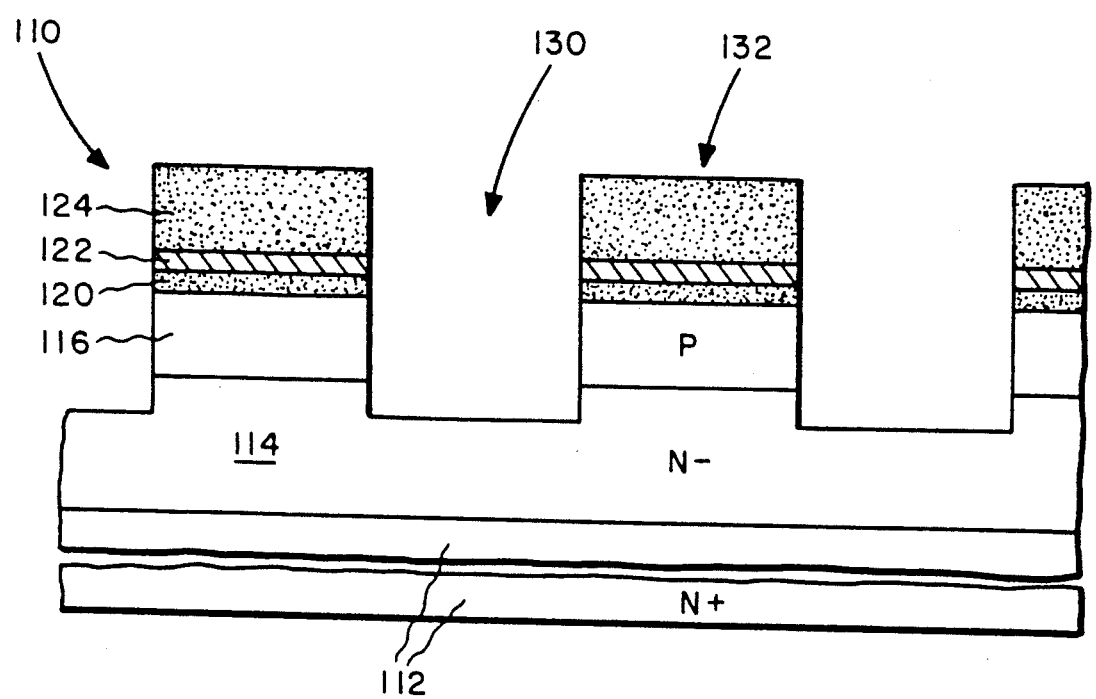
Figure 15:
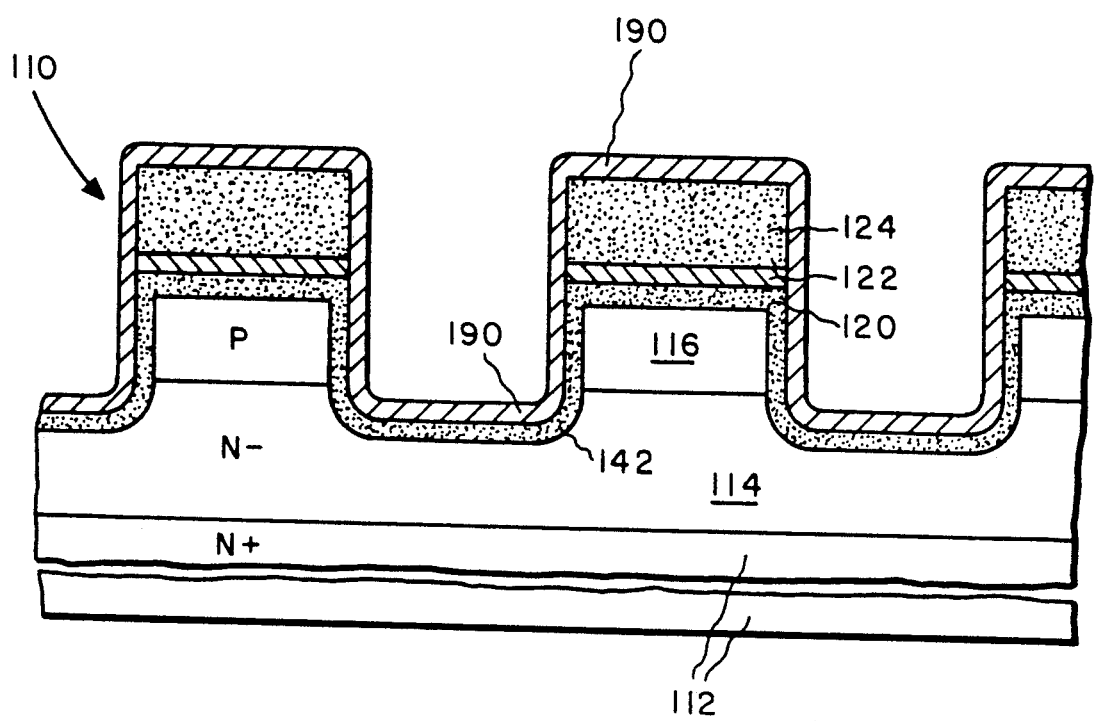

The photoresist layer is then preferably removed and the silicon material of the wafer is etched down through the P type region 116 and the wafer appears as shown in FIG. 14. Thereafter, a damage removal step is employed which may be either oxide growth and removal or direct silicon etching as discussed above. Thereafter, the gate oxide layer 142 is grown on the walls of the trenches and a thin silicon nitride layer 190 is deposited over the entire wafer surface. At the end of this step, the wafer appears as illustrated in FIG. 15.

Figure 16:
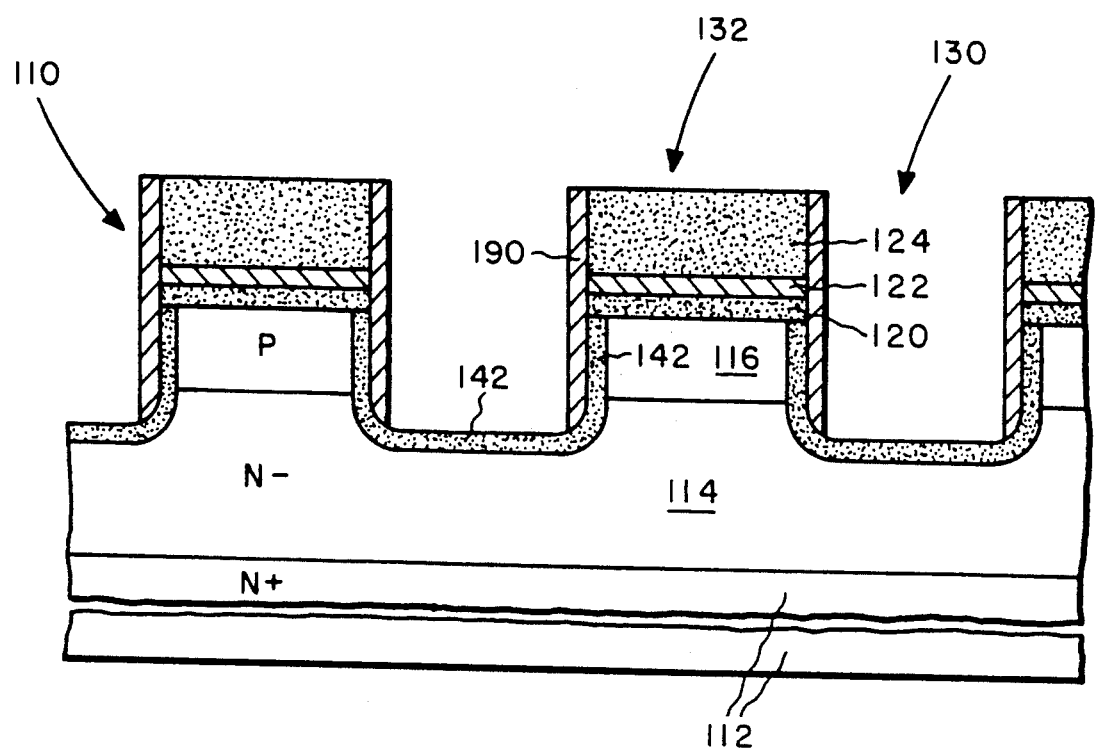

The wafer is then exposed to an RIE nitride etching process using the same gases as were used in etching to oxide, nitride, oxide masking layers. This removes the deposited thin nitride layer 190 from the top of the mesas 132 and the bottom of the trenches 130 while leaving it on the trench walls. It is only the removal from the bottom of the trenches which is important to the present process. At the end of this step the wafer appears as illustrated in FIG. 16.

Figure 17:
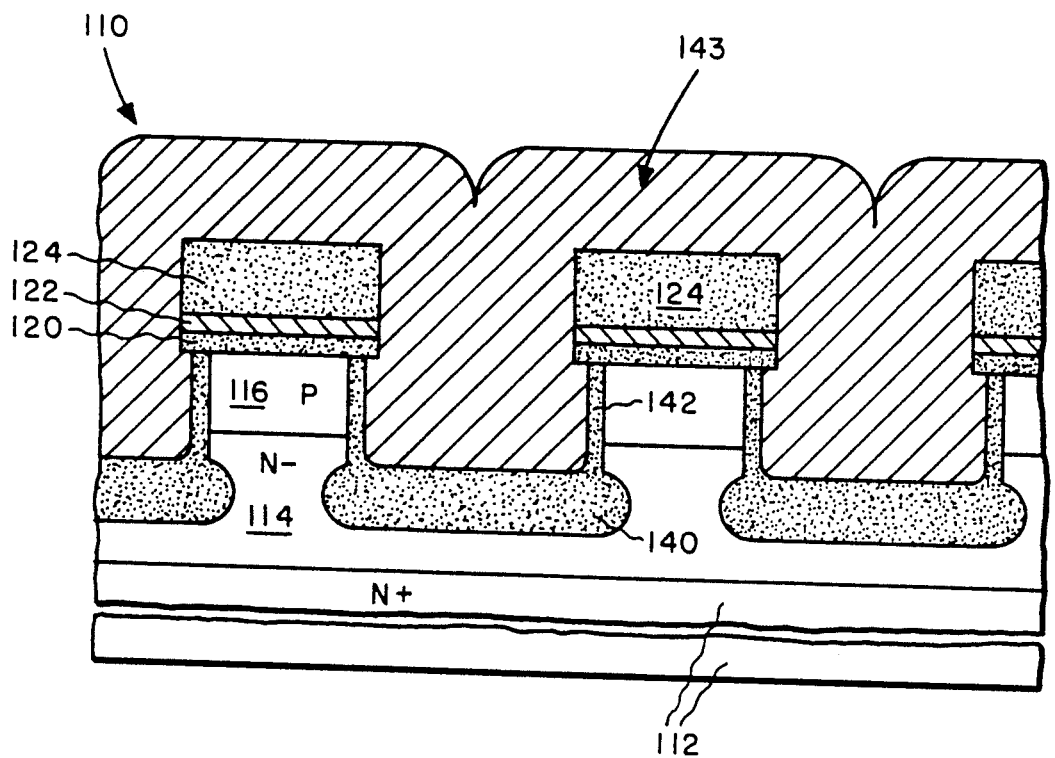

The wafer is then exposed to a long thermal oxidation step to grow thick oxide at the bottom of the trenches. The silicon nitride protective layer 190 is removed from the walls of the trenches in a wet etch. The trenches are then refilled with a gate conductor material which is preferably heavily doped N type polycrystalline silicon. At the end of this step, the wafer appears as illustrated in FIG. 17.

Figure 18:
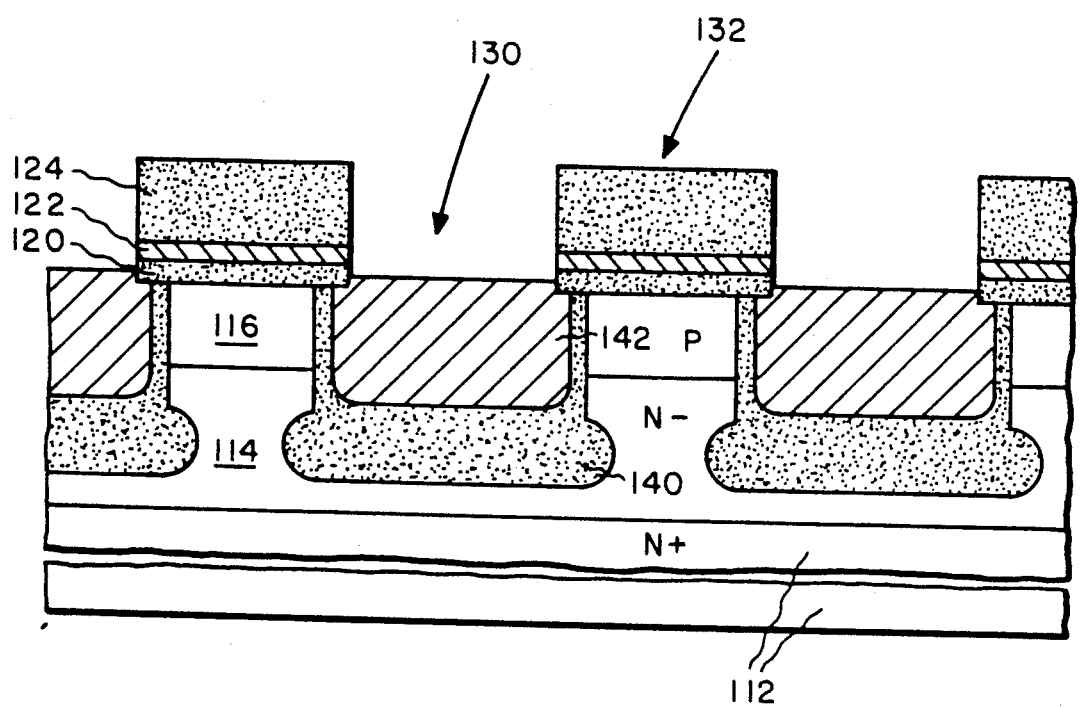

Next, the wafer is planarized by etching the polysilicon with a silicon selective etchant until the surface of the thick oxide layer 124 is exposed. The silicon etching is then terminated to leave the wafer appearing as illustrated in FIG. 18.

Figure 19:
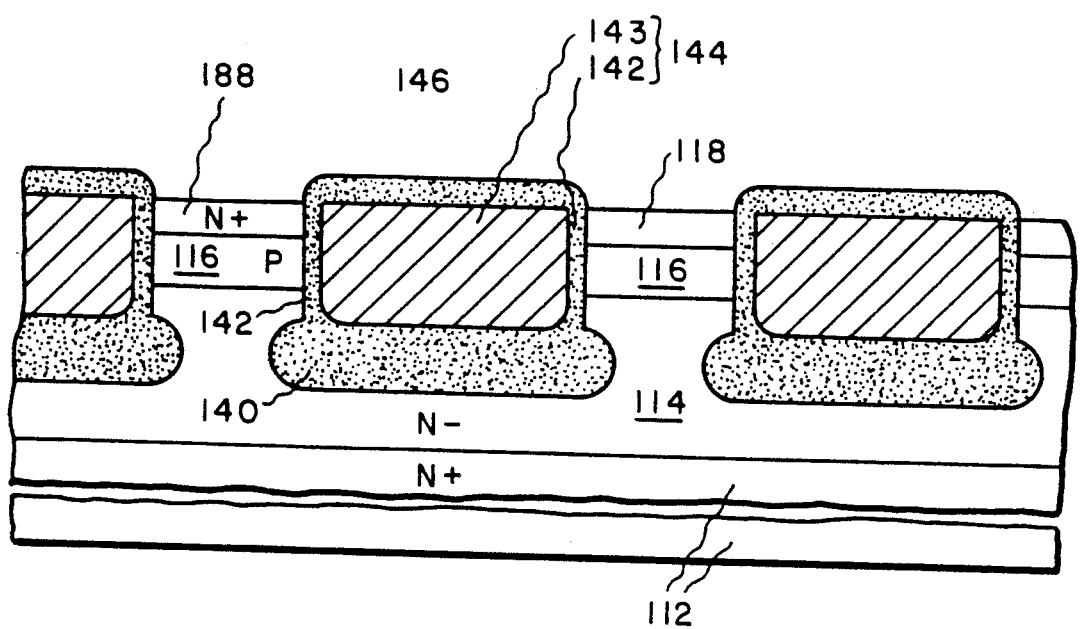

Next, the RIE mask is removed in a manner similar to that discussed above in connection with the preferred process and the source region is implanted to provide the structure illustrated in FIG. 19.

Figure 20:
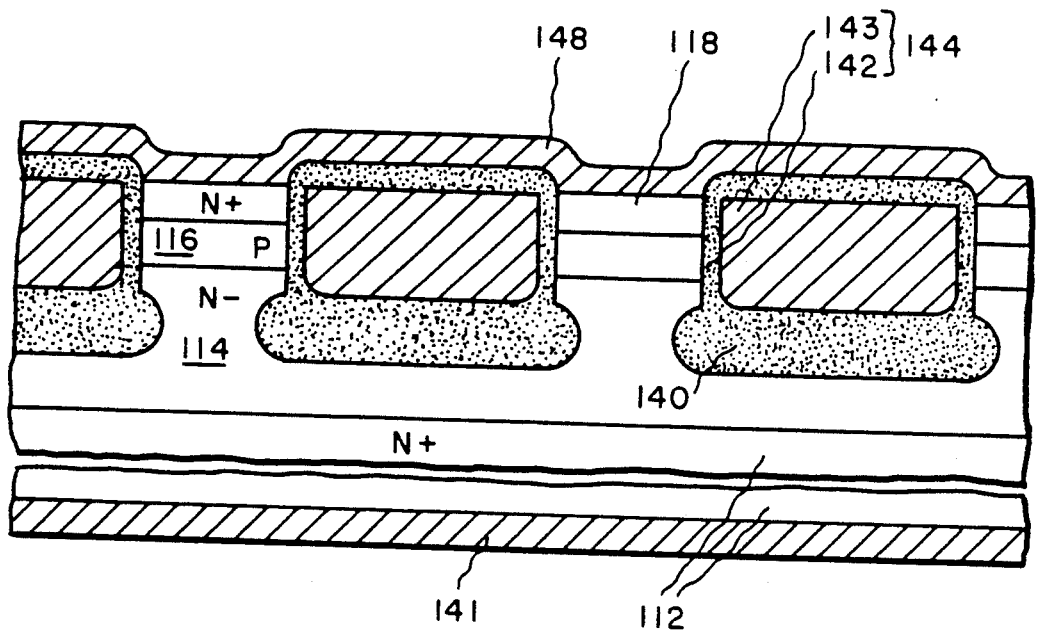

Thereafter, the electrodes 141 and 148 are formed on the wafer which has a final appearance as shown in FIG. 20. The structure illustrated in FIG. 20 differs from that illustrated in FIG. 11 in that the thick oxide/thin oxide interface has an abrupt change in oxide thickness which may result in undesired breakdown at the corner of the trenches where the thick and thin oxides meet.

This alternative process is considered less desirable than the preferred process because the final structure is considered less desirable than that produced by the preferred method and because the deposition of nitride layer 190, the RIE removal of portions of nitride layer 190, the long thermal oxidation and the removal of the remaining nitride layer 190 following the long thermal oxidation are additional steps not required in the formation of a DMOSFET and the reproducibility of these steps is less controlled.

While the method has been illustrated in terms of the formation of an FET having N type source and drain regions and P type body region, reversal of all conductivity types will result in a complementary device. Other RIE mask structures than those illustrated may be employed, if desired, as may alternative techniques for preventing growth of a thick oxide on the trench walls in the alternative process. This process is applicable to V-groove and other groove configurations in addition to the square or U-groove design which has been illustrated and described. The trench may comprise a grid or other configuration instead of the straight parallel segments illustrated.

While the invention has been described in detail herein in accord with certain preferred embodiments thereof, may modifications and changes therein may be effected by those skilled in the art. Accordingly, it is intended by the appended claims to cover all such modifications and changes as fall within the true spirit and scope of the invention.

What is claimed is:
1. A method of fabricating a trench gate semiconductor device comprising the steps of:
(a) providing a silicon semiconductor wafer of a first type conductivity;
(b) growing a thermal oxide layer on a first major surface of said wafer;
(c) depositing a thin silicon nitride layer on said thermal oxide layer;
(d) ion implanting a second conductivity type dopant through said oxide and nitride layers into the underlying silicon;
(e) forming and patterning a reactive ion etching masking layer over said nitride layer to define a trench location;
(f) reactive ion etching a trench into said silicon material;
(g) implanting oxygen ions into the bottom wall of said trench;
(h) thermal annealing said second conductivity type implanted region and said oxygen implanted region, respectively, to form the desired second conductivity type region and silicon oxide;
(i) removing damaged material from the sidewalls of said trench and any silicon on the bottom of said trench over said silicon oxide;

(j) growing a thin gate oxide layer on the sidewalls of said trench;

(k) filling said trench with conductive gate material;

(l) planarizing said wafer by removing said conductive gate material from over said reactive ion etching mask;

(m) removing said reactive ion etching mask;

(n) forming a first conductivity type region in said second conductivity type region adjacent said first major surface of said wafer; and (o) forming metallic electrodes on said device.

2. The method recited in claim 1 wherein step (e) comprises the steps of:

(1) depositing a thick silicon oxide layer over said silicon nitride layer;

(2) providing a patterned mask over said thick oxide layer; and (3) reactive ion etching a trench in said thick oxide layer in the opening in said mask.

3. A method of fabricating a trench gate semiconductor device comprising the steps of:

(a) providing a silicon semiconductor wafer of a first type conductivity;

(b) growing a thermal oxide layer on a first major surface of said wafer;

(c) depositing a thin silicon nitride layer over said thermal oxide layer;

(d) ion implanting a second conductivity type dopant through said oxide and nitride layers into the underlying silicon of said wafer;

(e) annealing said implanted dopant to form a desired second conductivity type region;

(f) forming and patterning a reactive ion etching masking layer over said nitride layer to define a trench location;

(g) reactive ion etching a trench into said silicon material;

(h) removing damaged surface material from the walls of said trench;

(i) growing a thin gate oxide on the walls of said trench;

(j) forming a protective layer on the sidewalls of said trench;

(k) growing a thick oxide layer at the bottom of said trench;

(l) removing said protective layer from said sidewalls;

(m) filling said trench with conductive gate material;

(n) planarizing said wafer to expose said reactive ion etching masking layer;

(o) removing said reactive ion etching mask;

(p) forming a first conductivity source region in said second conductivity type region adjacent said first major surface of said wafer; and (q) forming metallic electrodes on said device.

4. The method recited in claim 3 wherein step (f) comprises the steps of:

(1) depositing a thick silicon oxide layer over said silicon nitride layer;

(2) providing a patterned photoresist layer over said thick oxide layer; and (3) reactive ion etching a trench in said thick oxide layer.

5. The method recited in claim 4 wherein step (j) comprises:

depositing a silicon nitride layer on said wafer; and removing said silicon nitride layer from the bottom of said trench.

* * * * *